United States Patent
Hong

(10) Patent No.: US 12,513,913 B2
(45) Date of Patent: Dec. 30, 2025

(54) SELECTIVE ELEMENT DOPED WITH CHALCOGEN ELEMENT

(71) Applicant: INDUSTRY-UNIVERSITY COOPERATION FOUNDATION HANYANG UNIVERSITY, Seoul (KR)

(72) Inventor: Jin Pyo Hong, Seoul (KR)

(73) Assignee: INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 410 days.

(21) Appl. No.: 18/040,734

(22) PCT Filed: Sep. 6, 2021

(86) PCT No.: PCT/KR2021/012020
§ 371 (c)(1),
(2) Date: Feb. 6, 2023

(87) PCT Pub. No.: WO2022/055197
PCT Pub. Date: Mar. 17, 2022

(65) Prior Publication Data
US 2023/0309323 A1    Sep. 28, 2023

(30) Foreign Application Priority Data

Sep. 9, 2020 (KR) .................. 10-2020-0115510
Aug. 27, 2021 (KR) .................. 10-2021-0113780

(51) Int. Cl.
H10B 63/00    (2023.01)
H10B 61/00    (2023.01)

(52) U.S. Cl.
CPC .............. *H10B 63/24* (2023.02); *H10B 61/10* (2023.02)

(58) Field of Classification Search
CPC ........ H10B 63/24; H10B 61/10; H10N 70/25; H10N 70/826; H10N 70/8833
See application file for complete search history.

(56) References Cited

U.S. PATENT DOCUMENTS 8,427,860 B2   4/2013  Ohba et al.
2016/0133691 A1* 5/2016  Phatak ................... H10B 12/03
                                                   257/532

FOREIGN PATENT DOCUMENTS

KR        10-1559292 B1    10/2015
KR        10-2019-0142335 A  12/2019
KR        10-2020-0072627 A   6/2020
KR        10-2020-0094108 A   8/2020

OTHER PUBLICATIONS

International Search Report for PCT/KR2021/012020 dated Nov. 29, 2021 (PCT/ISA/210).

* cited by examiner

*Primary Examiner* — Julia Slutsker
(74) *Attorney, Agent, or Firm* — Sughrue Mion, PLLC

(57) ABSTRACT

Disclosed is a selective device having high selectivity and temperature stability. The selective device has a doped insulating layer. The doped insulating layer has a metal oxide and a chalcogen element introduced into the metal oxide. Metal oxide has amorphous structure with minimized defects, and the introduced chalcogen elements form a conductive channel at a specific voltage and realize bi-directional switching characteristics.

7 Claims, 6 Drawing Sheets

【FIG. 1】
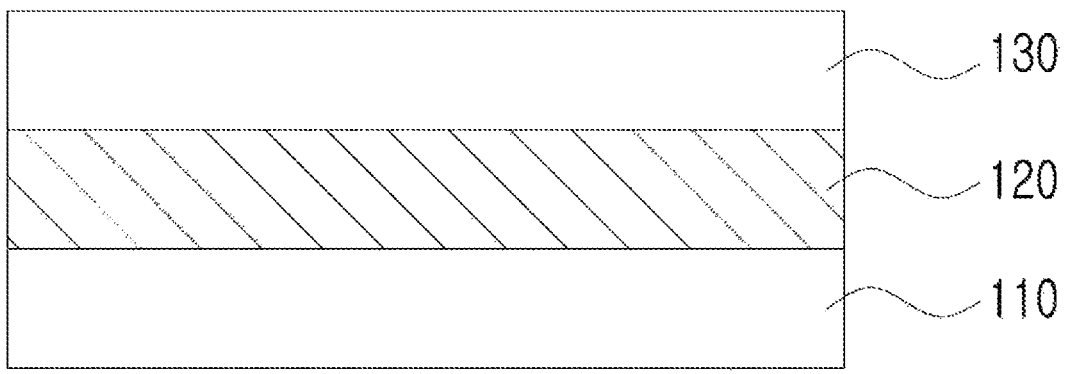

[FIG. 2]
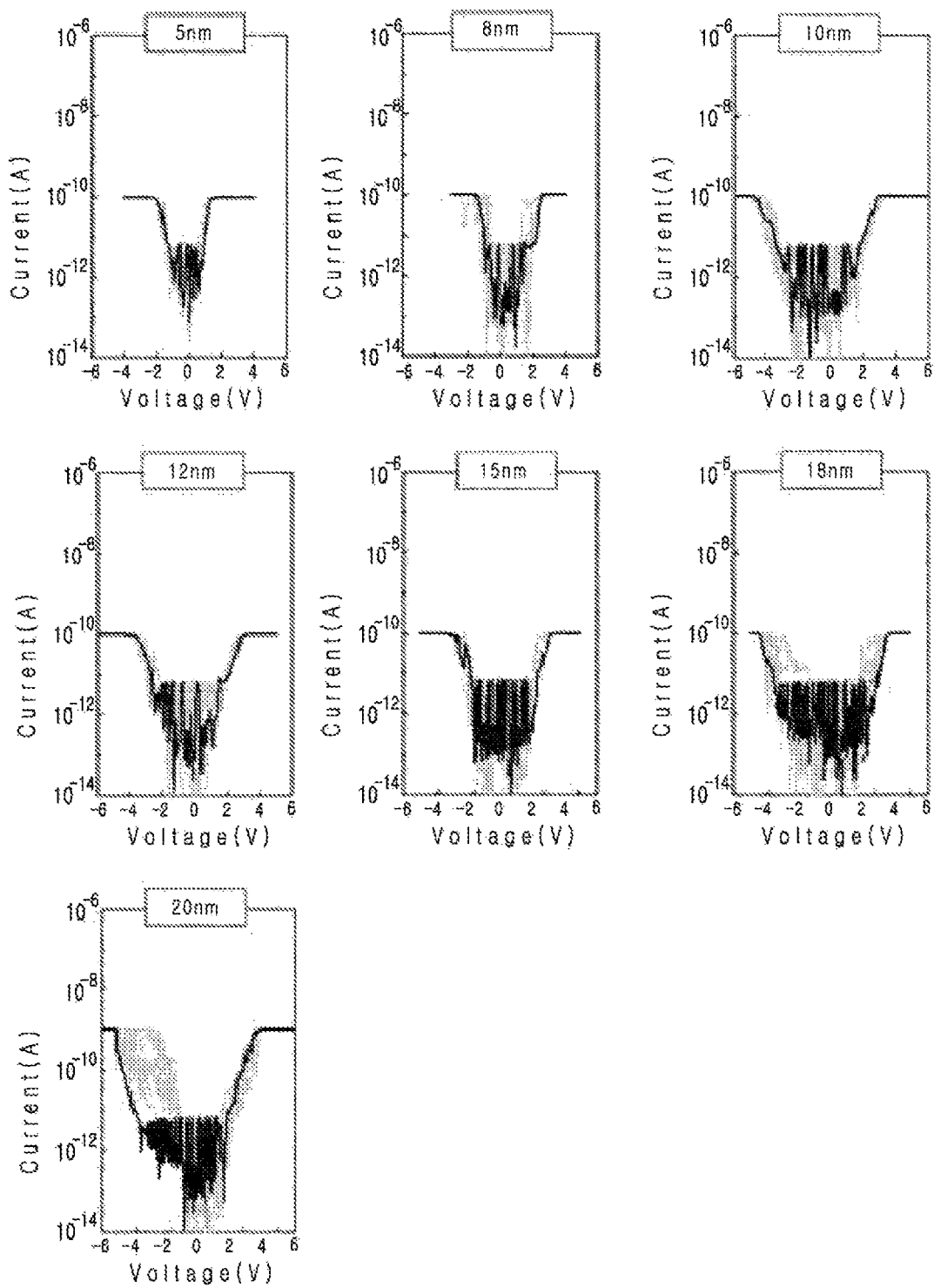

[FIG. 3]
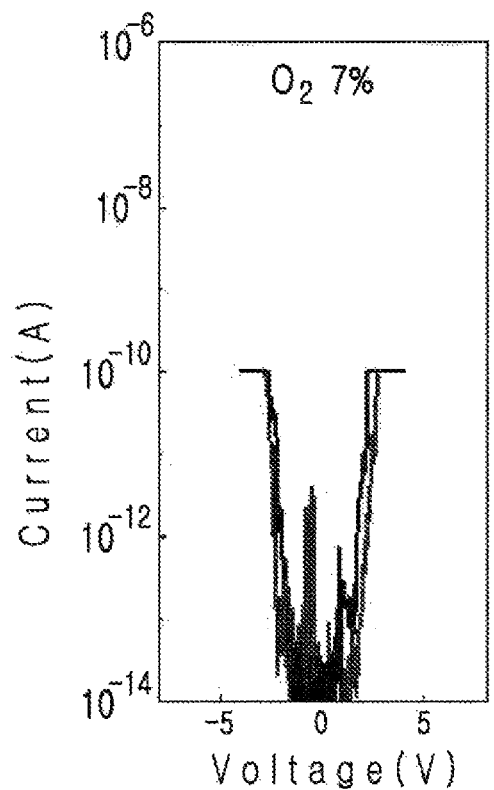
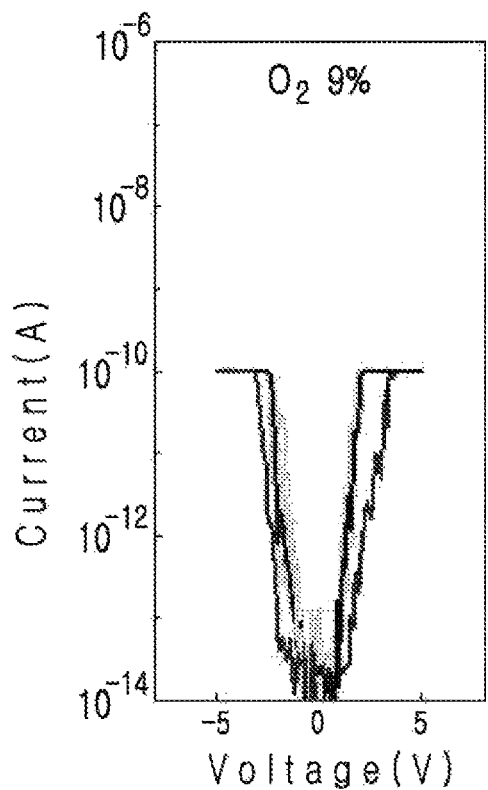
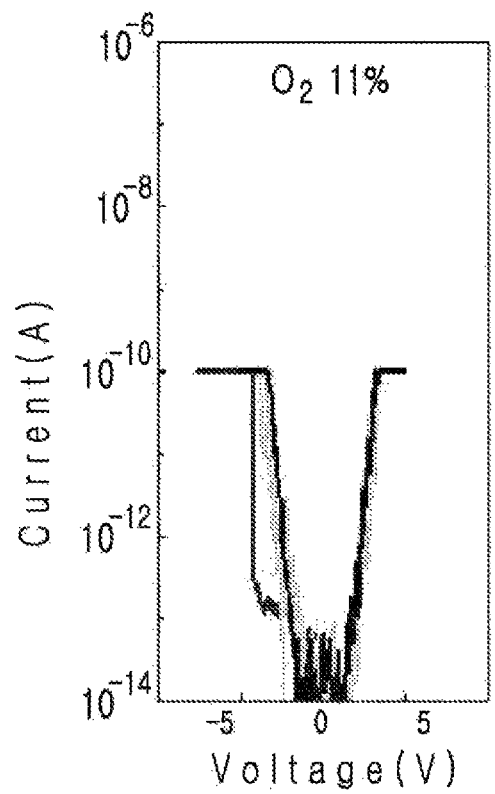
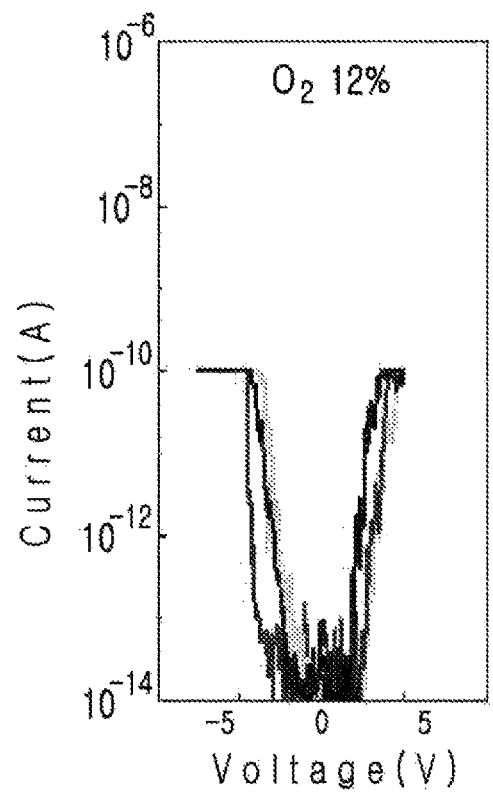

[FIG. 4]
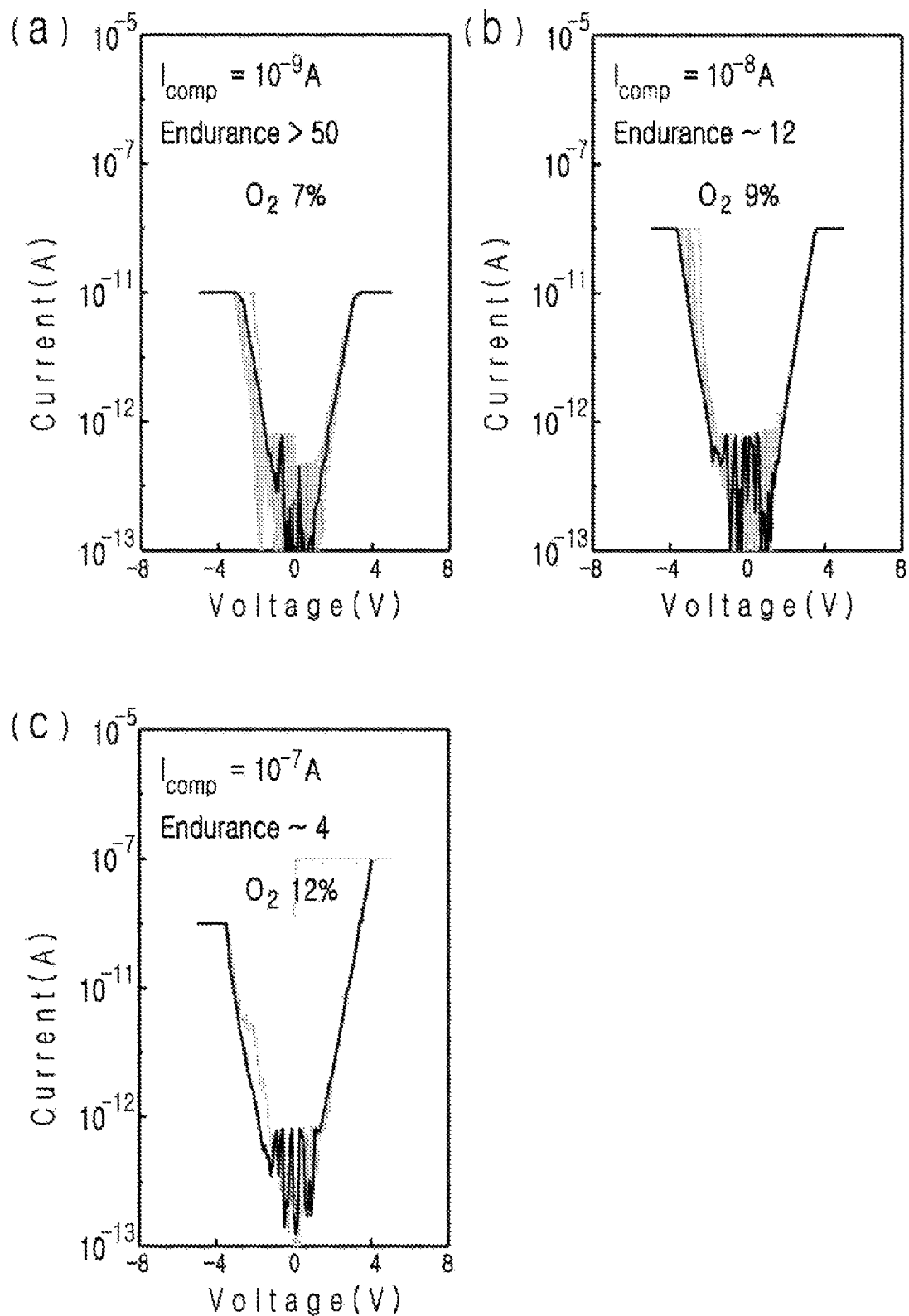

[FIG. 5]
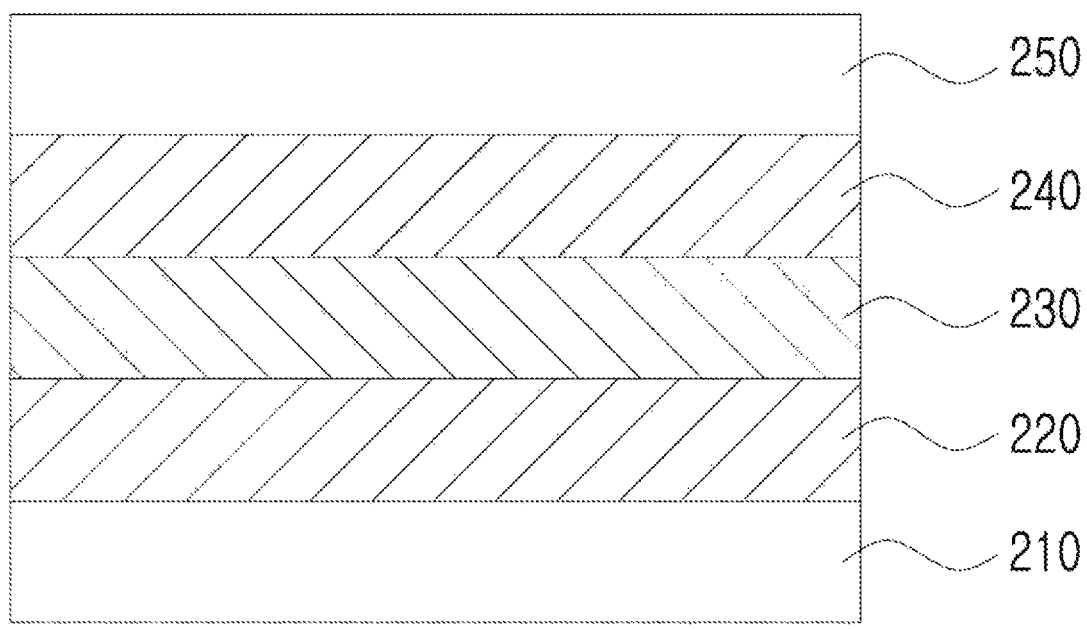

[FIG. 6]
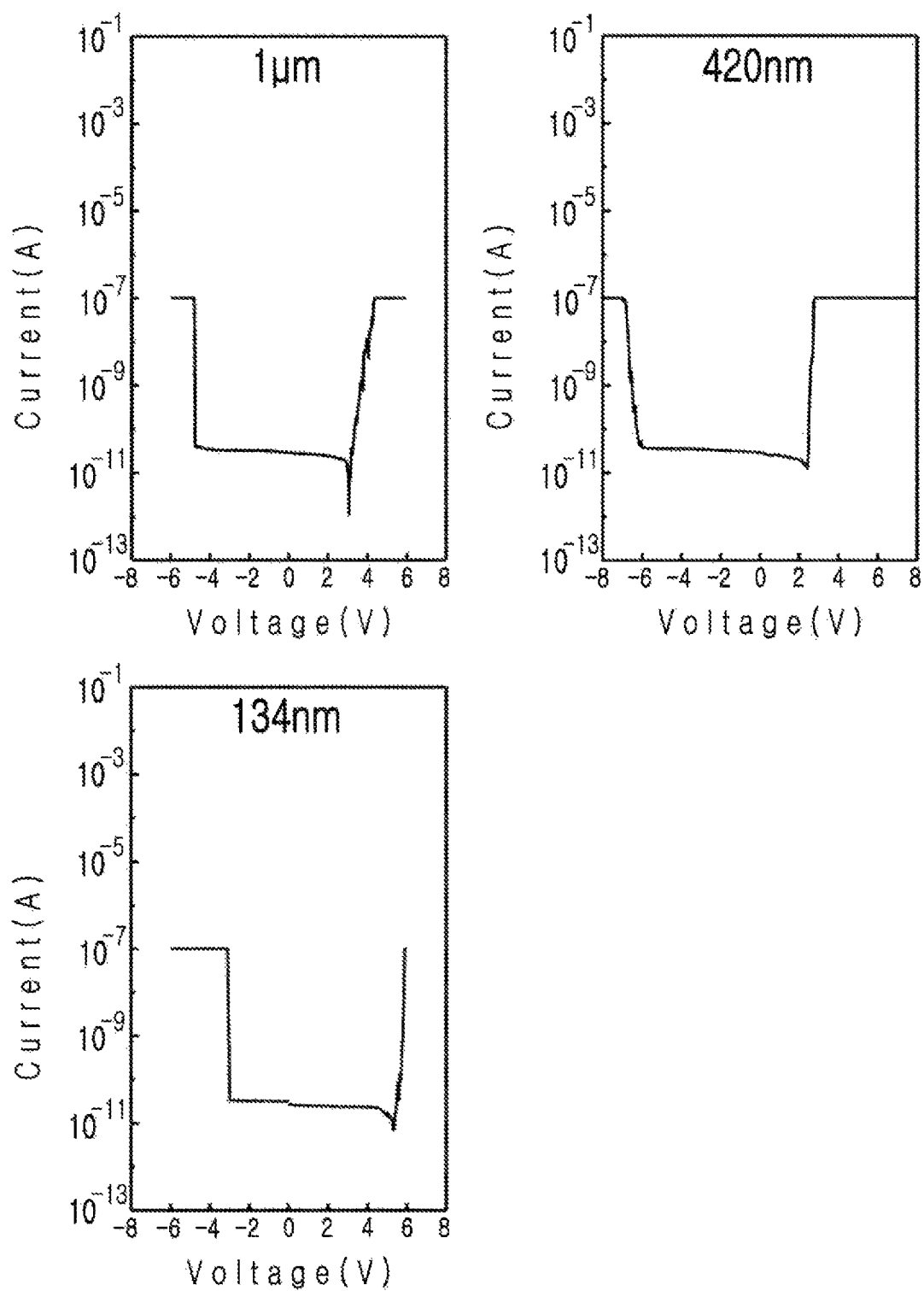

SELECTIVE ELEMENT DOPED WITH CHALCOGEN ELEMENT

CROSS REFERENCE TO RELATED APPLICATIONS

This application is a National Stage of International Application No. PCT/KR2021/012020 filed Sep. 6, 2021, claiming priorities based on Korean Patent Application No. 10-2020-0115510 filed Sep. 9, 2020 and Korean Patent Application No. 10-2021-0113780 filed Aug. 27, 2021.

TECHNICAL FIELD

The present invention is related to a selective device of a memory cell, and more particularly, to a selective device having excellent switching characteristics by doping with a chalcogen element or chalcogenide material in insulator.

BACKGROUND ART

The metal oxide has insulating properties and has an amorphous structure in most cases. In addition, a chalcogenide material (S, Se, Te or an alloy thereof, etc.) has an amorphous structure and is a semi-metal material that is also used as a compound semiconductor. In general, a chalcogenide material has a group 6 chalcogen element and has phase transformation characteristics, so it is used as a switching device.

A large number of defects exist in the chalcogenide material, and the defects tend to spread easily and quickly by external electrical stimulation. Accordingly, the chalcogenide material exhibits a threshold switching characteristic, and is used as a selection device based on the threshold switching characteristic. However, when used as a selection device, leakage current is high at the off-state and thermal instability appears because diffusion occurs easily. Various attempts have been made to reduce off-state current and secure thermal stability in a selection device made of a chalcogenide material.

Memory device is disclosed in U.S. Pat. No. 8,427,860, in which a transition metal such as Hf is added together with oxygen in an intermediate layer, and a chalcogen element is included in a transition metal oxide. In particular, it is intended to realize high resistance by adjusting the flow rate of oxygen during the deposition process. This is to use the switching characteristics of the chalcogen element and the insulating characteristics of the oxide material, and the intermediate layer is formed in contact with the resistance change layer, and is a configuration for easily inducing resistance change according to the phase change in the resistance change layer.

In addition, phase change film is disclosed in Korean Patent Registration No. 0695888, and a composition in which the phase change film includes a chalcogen compound and is doped with a silicon element. The specific resistance of the phase change film is increased by the silicon element doped into the chalcogen compound, and the phase change occurs even at a low pulse current.

However, the above patents are configured to induce a phase transformation of the resistance change layer made of a phase change material or a material that facilitates the phase change itself.

A resistance change layer that performs a phase change operation or magnetoresistance change operation is applied to a unit cell of a memory, and in order to perform independently access to the unit cells, a selective device needs to be connected to the resistance change layer constituting the unit cell. The selective device is a device that performs an on/off operation by a voltage applied through a conductive line. When the selective device is formed using only the chalcogen element, excellent on/off characteristics can be obtained, but leakage current is a problem in the off-state.

DISCLOSURE

Technical Problem

The present invention is directed to providing selective device that maintains a low current level in off-state and has thermal stability.

Technical Solution

One aspect of the present invention provides a selective device. The selective device includes a lower electrode, a doped insulating layer formed on the lower electrode and doped with a chalcogen element in a metal oxide, and an upper electrode formed on the doped insulating layer.

Another aspect of the present invention provides a selective device. The selective device includes a lower electrode, a lower insulating layer formed on the lower electrode, a doped insulating layer formed on the lower insulating layer and doped with a chalcogen element in a metal oxide, an upper insulating layer formed on the doped insulating layer and made of the same material as the lower insulating layer, and an upper electrode formed on the upper insulating layer.

Advantageous Effects

According to the present invention, the chalcogen element is artificially doped into the metal oxide, which is an insulator with controlled defects. The doped chalcogen element has an unshared electron pair, and the chalcogen element acts as a defect by the unshared electron pair. Defects in the amorphous structure may form a conductive path when a specific voltage level is applied, and excellent on/off characteristics may be secured. In addition, the metal oxide acting as a matrix in which the doped chalcogen element is distributed has high insulating property and electrical characteristics that are insensitive to temperature changes. So, the selective device can secure thermal stability.

In addition, the cross-point memory having the above-described selective device has a resistance change layer connected to the selective device. For the resistance change operation in the resistance change layer, the selective device is connected in series to the resistance change layer, performs a switching operation with respect to the threshold value of applied voltage, minimizes leakage current even in an off state, and secures thermal stability.

Effects of the present invention are not limited to the above-described effects and other unmentioned effects may be clearly understood by those skilled in the art from the following descriptions.

DESCRIPTION OF DRAWINGS

FIG. 1 is a cross-sectional view showing a selective device according to a preferred embodiment of the present invention.

FIG. 2 is a graph showing the current voltage characteristics of the selective device of FIG. 1 according to Preparation Example 1 of the present invention.

FIG. 3 is a graph showing current voltage characteristics of a selective device according to Preparation Example 2 of the present invention.

FIG. 4 is another graph showing current voltage characteristics of the selective device of FIG. 1 according to a preferred embodiment of the present invention.

FIG. 5 is a cross-sectional view showing another selective device according to a preferred embodiment of the present invention.

FIG. 6 is a graph showing current voltage characteristics of the selective device of FIG. 5 according to a preferred embodiment of the present invention.

MODES OF THE INVENTION

Since the present invention may be variously changed and have various forms, specific embodiments will be exemplified in the drawings and described in detail in the text. However, it should be understood that this does not limit the present invention to a specific disclosure, and includes all modifications, equivalents and substitutes included in the spirit and the scope of the present invention. In a description of each drawing, similar reference numerals are used for similar elements.

Unless otherwise defined, all terms used herein, including technical or scientific terms, have the same meaning as generally understood by those skilled in the art. Terms such as terms defined in generally used dictionaries should be interpreted as having meanings consistent with the meanings in the context of the related art, and should not be interpreted in an idealistic or excessively formal sense unless otherwise defined in the present application.

Hereinafter, exemplary embodiments of the present invention will be described in more detail with reference to the accompanying drawings.

EMBODIMENT

FIG. 1 is a cross-sectional view showing a selective device according to a preferred embodiment of the present invention.

Referring to FIG. 1, the selective device has a lower electrode 110, a doped insulating layer 120 and an upper electrode 130.

The lower electrode 110 is a conductor and is preferably made of a material suitable for bi-directional switching operation of the selective device. The lower electrode 110 may include Pt, W, TiN or TaN.

The doped insulating layer 120 is formed on the lower electrode 110. The doped insulating layer 120 is doped with a chalcogen element in an insulator, and preferably has high insulating property in an off-state and high turn-on current in an on-state.

To acquire properties in off-state and on-state, the doped insulating layer 120 may have a metal oxide, and preferably includes $Ta_2O_5$ or $HfO_2$. In addition, it is preferable that the chalcogen element to be doped is chalcogenide or as alloy thereof. The chalcogen element to be doped may have Te, Se, S, TeSe or TeS. However, it is preferable that oxygen is excluded from the doped chalcogen element. In addition, the metal oxide forming the matrix of the doped insulating layer 120 has an amorphous structure. However, it is necessary to minimize defects by controlling the defects in the amorphous structure. When a defect is occurred due to an unshared pair of electrons occurs in the amorphous structure, the insulating metal oxide may generate a leakage current. To control the defects, when forming the doped insulating layer 120, the thickness and defects of the doped insulating layer 120 can be controlled through a manufacturing method such as sputtering.

In addition, when the process for forming the metal oxide is performed, a chalcogen element is also doped into the layer in a simultaneous process. The chalcogen element exists preferably as an impurity in the metal oxide of amorphous structure without reacting with the metal or oxygen constituting the metal oxide. Therefore, the doped chalcogen element exists as a defect in the metal oxide of amorphous structure, and a bias is applied to the doped insulating layer 120, the doped chalcogen element acts as a hopping site where charge or electron moves in the doped insulating layer 120.

So, the metal oxide forming the matrix of the doped insulating layer 120 needs to form a stable bond, and the chalcogen element needs to have high electron affinity to act as a hopping site through which electrons or ions can move. For example, it is preferable that Se or Te is used as the chalcogen element, and an alloy of the chalcogen element is also possible.

An upper electrode 130 is formed on the doped insulating layer 120. The upper electrode 130 preferably has the same composition as the lower electrode 110 and is preferably made of Pt, TiN or TaN.

Preparation Example 1: $HfO_2$ Doped with Te as Chalcogen Element

Tungsten (W) is used as the lower electrode. A doped insulating layer is formed on the lower electrode through co-sputtering process. The $HfO_2$ target and the Te target are independently disposed, and RF power of 70 W is applied to the $HfO_2$ target, and power of 2 to 7 W is applied to the Te target. $Ar/O_2$ as the atmospheric gas is supplied at a flow rate of 20 sccm, and the partial pressure of $O_2$ is controlled for doping with Te that is a chalcogen element, and for stable formation of $HfO_2$.

The thickness of the doped insulating layer is determined by the process time, and the partial pressure of $O_2$ in the atmospheric gas is determined by the ratio of $Ar:O_2$. Preferably, the partial pressure ratio of $Ar:O_2$ is 10:0.7 to 10:1.2. When the partial pressure of $O_2$ is lower than the above range, many defects are generated in the $HfO_2$ forming matrix due to the low oxygen partial pressure. Therefore, the matrix does not secure insulation and exhibits linear switch characteristics. That is, at a low oxygen partial pressure, cationic defects of Hf are generated, so that the doping effect of Te does not appear significantly. In addition, when the oxygen partial pressure exceeds the above-mentioned range, due to the high oxygen concentration, Te, a chalcogen element, is combined with oxygen, and the doping effect does not appear.

After forming the doped insulating layer, the upper electrode is diposited with Pt, and the selective device of FIG. 1 is formed.

FIG. 2 is a graph showing the current voltage characteristics of the selective device of FIG. 1 according to Preparation Example 1 of the present invention.

Referring to FIG. 2, in order to implement bi-directional switching characteristics, current flowing through upper electrode or lower electrode needs to be concentrated at a portion of a doped insulating layer.

In addition, the lower electrode has W (tungsten), the doped insulating layer is composed of $HfO_2$, and the chalcogen element doped in the doped insulating layer is Te. Also, the upper electrode has Pt. Voltage is applied between the upper electrode and the lower electrode, and the selective device exhibits bi-directional switching characteristics.

In particular, it can be seen that as the thickness of the doped insulating layer increases, the off-current decreases due to the insulating properties of the oxide material.

In addition, when the insulating layer of the conventional HfOx substrate has a thickness of 100 nm or less, bi-directional switching characteristics do not appear, but in this embodiment, bi-directional switching characteristics appear even at a thickness of about 15 nm.

The bi-directional switching characteristics is due to the introduction of a chalcogen element as a dopant in a state in which metal oxide defects are controlled in the doped insulating layer of the present embodiment.

That is, even if the doped insulating layer has a thickness of 5 nm to 20 nm, bi-directional switching characteristics are manifested. However, it is confirmed that the bi-directional switching characteristics vary greatly from a thickness of 18 nm or more depending on the repetitive application of bias (upper electrode (+), lower electrode (−)) applied to the upper and lower electrodes. It can be seen that this is further intensified when the doped insulating layer has a thickness of 20 nm.

Therefore, the thickness of the doped insulating layer is preferably set to 5 nm to 20 nm. In addition, it is more preferable that the thickness of the doped insulating layer is set to 5 nm to 15 nm.

Preparation Example 2: $HfO_2$ Doped with Se as Chalcogen Element

Tungsten (W) is used as the lower electrode. A doped insulating layer is formed on the lower electrode through a co-sputtering process. The $HfO_2$ target and the Se target are independently disposed, and RF power of 70 W is applied to the $HfO_2$ target, and power of 5 to 10 W is applied to the Se target. Ar gas is supplied at a flow rate of 10 sccm, and the $O_2$ gas is supplied while being changed according to the partial pressure ratio.

The thickness of the doped insulating layer is determined by the process time, and the partial pressure of oxygen in the atmospheric gas is determined by the ratio of $Ar:O_2$. Preferably, the partial pressure ratio of $Ar:O_2$ is 10:0.7 to 10:1.2. That is, the partial pressure of oxygen is preferably set to 7% to 12% compared to argon gas.

FIG. 3 is a graph showing current voltage characteristics of a selective device according to Preparation Example 2 of the present invention.

Referring to FIG. 3, when the partial pressure of oxygen is in the range of 7% to 12%, stable bi-directional switching characteristics are secured. In particular, it is confirmed that the off-current has a value of less than $10^{-13}$ A even in a number of repetitive operations.

FIG. 4 is another graph showing current voltage characteristics of the selective device of FIG. 1 according to a preferred embodiment of the present invention.

Referring to FIG. 4, materials constituting the electrodes are the same as described in FIG. 2 except for the configuration of the doped insulating layer. The doped insulating layer has $Ta_2O_5$ doped with Te. In addition, the thickness of the doped insulating layer is set to 15 nm, and the partial pressure of oxygen gas to argon gas is set to 7%, 9%, or 12%. When the partial pressure ratio of oxygen in within a specific range, bi-directional switching characteristics are appeared, and a high on/off current ratio is implemented.

In FIG. 4, the off-state current has a value of less than $10^{-11}$ A, and the turn-on state current has a value of $10^{-9}$ A or more. That is, it can be seen that the on/off current ratio is greater than or equal to $10^2$.

FIG. 5 is a cross-sectional view showing another selective device according to a preferred embodiment of the present invention.

Referring to FIG. 5, the selective device has a lower electrode 210, a lower insulating layer 220, a doped insulating layer 230, an upper insulating layer 240 and an upper electrode 250. The lower electrode 210 or the upper electrode 250 may have Pt, W, TiN, or TaN as a conductive material.

The lower insulating layer 220 formed on the lower electrode 210 is preferably an oxide of a transition metal and exhibits high insulating properties. This is equally applied to the upper insulating layer 240. The lower insulating layer 220 and the upper insulating layer 240 preferably have a thickness of tens of nanometers or less.

In particular, the lower insulating layer 220 and the upper insulating layer 240 are preferably made of the same material and have the same thickness. When the lower insulating layer 220 and the upper insulating layer 240 having the same material and the same thickness are used, symmetry of switching characteristics can be secured. That is, symmetry of bi-directional switching operation can be secured.

In particular, the lower insulating layer 220 and the upper insulating layer 240 are used to control the on/off current. When the thickness of the two insulating layers is thick, the on/off currents decrease, and when the thickness decreases, the magnitude of the on/off current increases.

A doped insulating layer 230 is formed between the lower insulating layer 220 and the upper insulating layer 240, and the doped insulating layer 230 includes a metal oxide having a transition metal. The metal oxide is preferably a film in which defects due to unshared electron pairs are controlled. In addition, it has high insulating property and excellent bi-directional switching ability in a state where the chalcogen element is doped.

FIG. 6 is a graph showing current voltage characteristics of the selective device of FIG. 5 according to a preferred embodiment of the present invention.

Referring to FIG. 6, the lower electrode has W, and the lower and upper insulating layers are made of $HfO_2$. Also, the doped insulating layer is preferably composed of a $HfO_2$ matrix and doped Te. An upper electrode formed on the upper insulating layer has Pt. In addition, the doped insulating layer may also be composed of $HfO_2$ and doped Se.

In addition, the upper insulating layer or the lower insulating layer is used to secure insulating property of the selective device, and nonlinear operation characteristics can be intensified. A doped insulating layer inserted into the two insulating layers has high insulating property in a specific voltage range and has bi-directional switching characteristics. As an upper insulating layer or a lower insulating layer may have $Ta_2O_5$ or $HfO_2$. In addition, the upper insulating layer or the lower insulating layer is preferably made of the same material as the metal oxide constituting the doped insulating layer, and is not doped with a chalcogen element.

In FIG. 6, the thickness of the doped insulating layer is 15 nm, and the size (diameter) of the lower electrode has range of 134 nm to 1 um. In addition, the upper insulating layer and the lower insulating layer have a width of 60 um, and the upper electrode has the same width as 60 um. Here, the thickness of the doped insulating layer is 15 nm, and the upper and lower insulating layers each have a thickness of 2 nm.

It can be seen that even if the size of the lower electrode is changed, the current at the turn-on of the selective device is constant on the scale of $10^{-7}$ A. Also, the off-state current has a $10^{-11}$ A scale. That is, it can be seen that the on/off current ratio is $10^4$, which indicates a very high on/off current ratio, and exhibits bi-directional switching characteristics even at a low voltage.

In the present invention described above, the selective device has a doped insulating layer. The doped insulating layer uses a metal oxide having controlled defects as a matrix, and a chalcogen element is included in the metal oxide. The chalcogen element may act as a defect and form a conductive channel by an externally applied voltage. In addition, due to the metal oxide with controlled defects, high insulating property can be maintained even when the temperature changes.

The invention claimed is:

1. A selective device comprising:
    a lower electrode;
    a doped insulating layer formed on the lower electrode and composed of a metal oxide doped with a chalcogen element; and
    an upper electrode formed on the doped insulating layer,
    wherein the metal oxide is $HfO_2$ or $Ta_2O_5$, and the chalcogen element is Te or Se,
    wherein the metal oxide has an amorphous structure, and the chalcogen element exists without reacting with metal or oxygen constituting the metal oxide and has unshared electron pair so that the unshared electron pair acts as a defect in the doped insulating layer.

2. The selective device of claim 1, wherein the chalcogen element acts as a defect that is a hopping site where charge or electron moves in the doped insulating layer.

3. The selective device of claim 2, wherein the doped insulating layer has thickness of 5 nm to 15 nm.

4. A selective device comprising:
    a lower electrode;
    a lower insulating layer formed on the lower electrode;
    a doped insulating layer formed on the lower insulating layer and composed of a metal oxide doped with a chalcogen element;
    an upper insulating layer formed on the doped insulating layer and made of the same material as the lower insulating layer; and
    an upper electrode formed on the upper insulating layer,
    wherein the metal oxide is $HfO_2$ or $Ta_2O_5$, and the chalcogen element is Te or Se,
    wherein the metal oxide has an amorphous structure, and the chalcogen element exists without reacting with metal or oxygen constituting the metal oxide and has unshared electron pair so that the unshared electron pair acts as a defect in the doped insulating layer.

5. The selective device of claim 4, wherein the chalcogen element acts as a defect that is a hopping site where charge or electron moves in the doped insulating layer.

6. The selective device of claim 4, wherein the upper insulating layer or the lower insulating layer has a metal oxide form which the chalcogen element of the doped insulating layer is excluded.

7. The selective device of claim 4, wherein the lower insulating layer and the upper insulating layer have the same thickness.

* * * * *